United States Patent [19]

Crozier

[11] Patent Number: 5,579,342

[45] Date of Patent: Nov. 26, 1996

[54] PRE-COMPENSATED FREQUENCY MODULATION (PFM)

[75] Inventor: Stewart N. Crozier, Kanata, Canada

[73] Assignee: Her Majesty the Queen in right of Canada as represented by the Minister of Communications, Ottawa, Canada

[21] Appl. No.: 300,189

[22] Filed: Sep. 22, 1994

[51] Int. Cl.[6] ........................................ H04K 1/02
[52] U.S. Cl. .................... 375/296; 375/271; 375/285; 375/286; 375/302; 375/322; 375/331; 332/124; 332/125; 330/149; 445/63; 371/37.8
[58] Field of Search ........................... 375/271, 279–281, 375/283–286, 296, 297, 302, 308, 322, 330, 331; 371/37.8, 30; 341/87, 94, 106; 332/103, 104, 107, 117, 123, 125, 183, 100; 330/149; 455/42, 43, 63, 110

[56] References Cited

U.S. PATENT DOCUMENTS 5,068,874  11/1991  Leitch ................................ 375/296
5,386,202   1/1995  Cochran et al. ...................... 375/296

OTHER PUBLICATIONS

A Comparison of Three QPSK Type Modulation Schemes for Mobile Satellite SCPC Voice and Data Services, Stewart N. Crozier, pp. 95–98—16th Biennial Symposium on Communications, Kingston, Ontario, Canada, May 27–29, 1992 Proceedings.

*Primary Examiner*—Stephen Chin
*Assistant Examiner*—Amanda T. Le
*Attorney, Agent, or Firm*—Pascal & Associates

[57] ABSTRACT

A system for transmitting FM signals comprised of apparatus for receiving an input data signal, apparatus for precompensating the received data signal, apparatus for applying the precompensated data signal to a constant envelope modulator to provide a modulated signal, apparatus for applying the modulated signal to a power efficient non-linear amplifier and transmitting a signal resulting therefrom, apparatus for receiving the transmitted signal in an I-Q receiver, and apparatus for filtering the received transmitted signal for the precompensation, to obtain an output data signal representative of the input data signal.

6 Claims, 11 Drawing Sheets

PRE-COMPENSATED FREQUENCY MODULATION (PFM)

FIELD OF THE INVENTION

This invention relates to a transmission system for FM signals including a precompensating transmitter and a distorting receiver, whereby a non-linear FM signal can be received in a linear distorting QPSK receiver.

BACKGROUND TO THE INVENTION

U.S. Pat. No. 5,093,637 describes systems in which signals of a QPSK (quaternary phase shift keying) modulation system are compensated for non-linear characteristics of a transmitter amplifier. It is stated in that patent that in Japanese patent disclosure publication number 214843/1986, a memory contains compensating factors which modify the real and imaginary parts of an input signal to effect compensation for the non-linearity of a subsequent transmitting amplifier. By subtracting a portion of the transmitting amplifier signal from the input signal, a correction factor to the data stored in the memory can be obtained, maintaining a compensated amplifier output signal even when characteristics of the amplifier change due to temperature changes. The subject matter of U.S. Pat. No. 5,093,637 relates to a generally similar device, but uses a structure which reduces the memory capacity requirements.

Unfortunately, where multi-level data signals are used, the transmitting amplifier must be a linear type of amplifier. This requires a large precompensation memory. The entire system from transmitter to receiver are for QPSK signals, and utilizes linear transmitters and receivers. The compensation of distortion in a linear system is straight forward.

However digital QPSK signals are desirable to be used for mobile satellite voice and data services, and are being considered for future satellite based personal communication systems. It is clear that power consumption, size and cost are important considerations for the design of mobile and personal communication terminals. In order to reduce the cost, it is desirable to use power efficient non-linear amplifiers such as saturated class-C amplifiers or switching amplifiers, which are typically two to four times more efficient than linear amplifiers, but are inherently highly non-linear. Use of such a power efficient transmitting amplifier directly impacts the size and cost of other terminal components such as the power supply, batteries and heat sinks. The aforenoted QPSK prior art system, requiring the use of linear or linearized systems, cannot use highly non-linear switching amplifiers or saturated class-C amplifiers.

SUMMARY OF THE INVENTION

The present invention is a new approach to digital M-level frequency modulation, which is denoted PFM (precompensated FM) and is a constant envelope modulation scheme which falls into the general class of continuous phase modulation. Multi-level data pulses are used to excite a pulse shaping filter followed by an FM modulator, followed by a power efficient non-linear amplifier such as a saturated class-C transmitter amplifier.

An unique precompensation scheme is used for the present PFM system which uses a highly efficient non-linear amplifier, the resulting signal of which can be received directly by a linear QPSK receiver, in which the signal can be easily detected.

Therefore rather than transmitting a linear QPSK signal for receipt in a linear QPSK receiver, but which uses a relatively inefficient linear or linearized transmitting amplifier, a specially precompensated FM signal is transmitted using a highly efficient non-linear amplifier such as a saturated class-C amplifier, the precompensation being of the form which adjusts the signal to be transmitted to one which can be received in a linear QPSK receiver.

In accordance with an embodiment of the invention, a system for transmitting constant envelope signals are comprised of apparatus for receiving an input data signal, apparatus for precompensating the received data signal, apparatus for applying the precompensated data signal to a constant envelope modulator to provide a modulated signal, apparatus for applying the modulated signal to a power efficient non-linear amplifier and transmitting a signal resulting therefrom, apparatus for receiving the transmitted signal in an I-Q receiver, and apparatus for filtering the received transmitted signal for the precompensation, to obtain an output data signal representative of the input data signal.

In accordance with another embodiment of the invention, a system for transmitting FM signals is comprised of apparatus for receiving input data bits, apparatus for applying undelayed and delayed representations thereof to a compensation table, to obtain an output compensation signal, apparatus for mapping the delayed bits into various amplitude real symbols depending on the number of symbols, apparatus for compensating the real symbols with the output compensation signal, apparatus for applying the compensated real symbols to a pulse shaping filter, apparatus for applying the output of the pulse shaping filter to an FM modulator, and apparatus for applying the output of the FM modulator to a non-linear amplifier.

BRIEF INTRODUCTION TO THE DRAWINGS

A better understanding of the invention will be obtained by reference to the detailed description below, in conjunction with the following drawings, in which:

FIG. 1 is a block diagram of a prior art $\pi/4$-DQPSK modulator with a hard limiter, FIG. 2 illustrates the mapping relationships between Gray coded phase difference I-Q constellations for $\pi/4$-DQPSK and the four-level pulses for PFM4 used in the present invention, FIG. 3A illustrates signalling constellations for $\pi/4$-DQPSK and PFM4, FIG. 3B illustrates a signalling constellation for DQPSK, FIG. 4 is a block diagram of a differential detector used in a receiver for $\pi/4$-DQPSK and PFM4 signals, FIG. 5 is a block diagram of a PFM4 modulator with a two-symbol (four-bit) compensation table, in accordance with an embodiment of the present invention, FIG. 6 is a block diagram of a PFM4 modulator with a four-symbol (eight-bit) compensation table, in accordance with an embodiment of the present invention, FIG. 7 is a block diagram of another embodiment of a PFM4 system with two-symbol (four-bit) compensation, in accordance with the present invention, FIG. 8 is a graph of the impulse response of a pulse shaping filter used in a prototype for PFM4, FIG. 9 is a scatter diagram for DQPSK, FIG. 10 is a scatter diagram for $\pi/4$-DQPSK, FIG. 11 is a scatter diagram for PFM4 (the present invention), FIG. 12 is a scatter diagram for FM4, with no precompensation, FIG. 13 is a graph of transmitted power spectra for DQPSK, π/4-DQPSK and PFM4, FIG. 14 is a graph of out-of-band power for DQPSK, π/4-DQPSK and PFM4, FIG. 15 is a graph of signal-to-interference ratio (SIR) for two equal power adjacent channel interferers, FIG. 16 is a graph of theoretical bit error rate (BER) performance of DQPSK, π/4-DQPSK and PFM4, assuming ideal coherent detection (with differential decoding) in an additive white gaussian noise (AWGN) channel with no adjacent channel interference, FIG. 17 is a graph of theoretical BER performance of DQPSK, π/4-DQPSK and PFM4, assuming ideal coherent detection (with differential decoding) in an AWGN channel with two adjacent channel interferers up 5 dB and with a channel spacing of two symbol rates, FIG. 18 is a graph of simulated BER performance of DQPSK, π/4-DQPSK and PFM4 with differential detection in an AWGN channel with no adjacent channel interference, and FIG. 19 is a graph of simulated BER performance of DQPSK, π/4-DQPSK and PFM4 with differential detection in an AWGN channel with two adjacent channel interferers up 5 dB and with a channel spacing of two symbol rates.

DETAILED DESCRIPTION OF THE INVENTION

Figure 1:
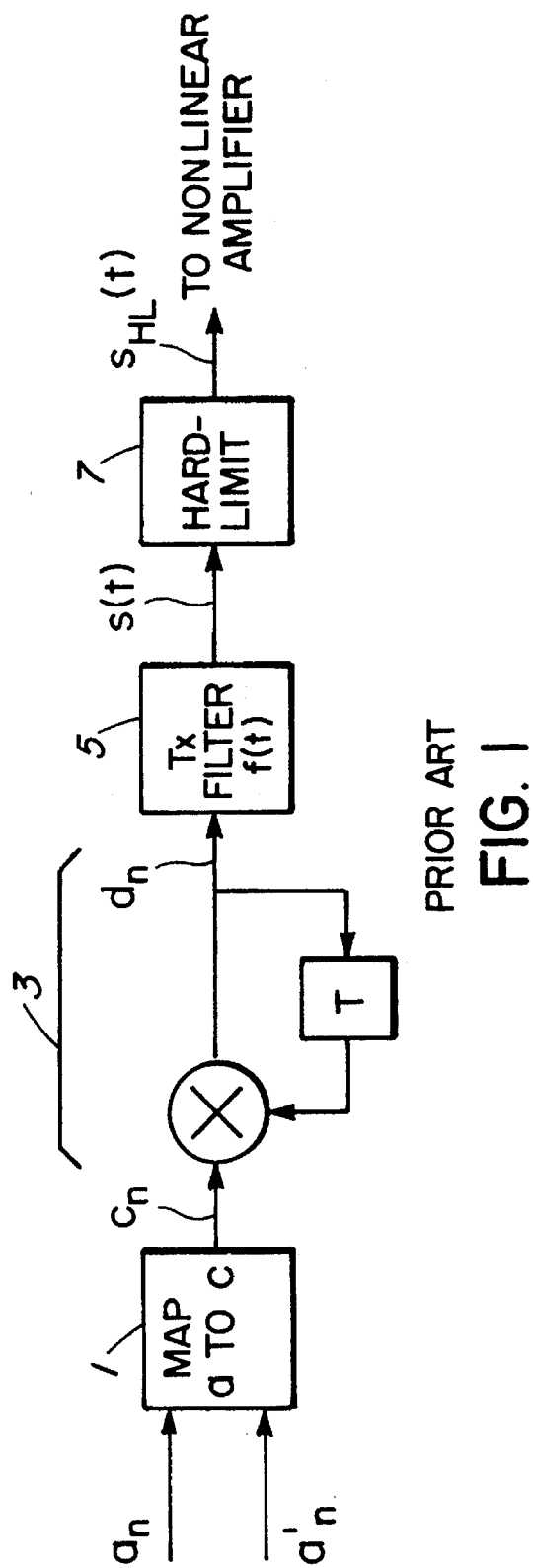

FIG. 1 shows a complex baseband signal translation system for a π/4-shifted differentially encoded QPSK (π/4-DQPSK) modulator in accordance with the prior art. The π/4-DQPSK signals are generated at the output of encoder 3. The thin lines represent real signal paths and the thick lines represent complex signal paths.

Figure 2:
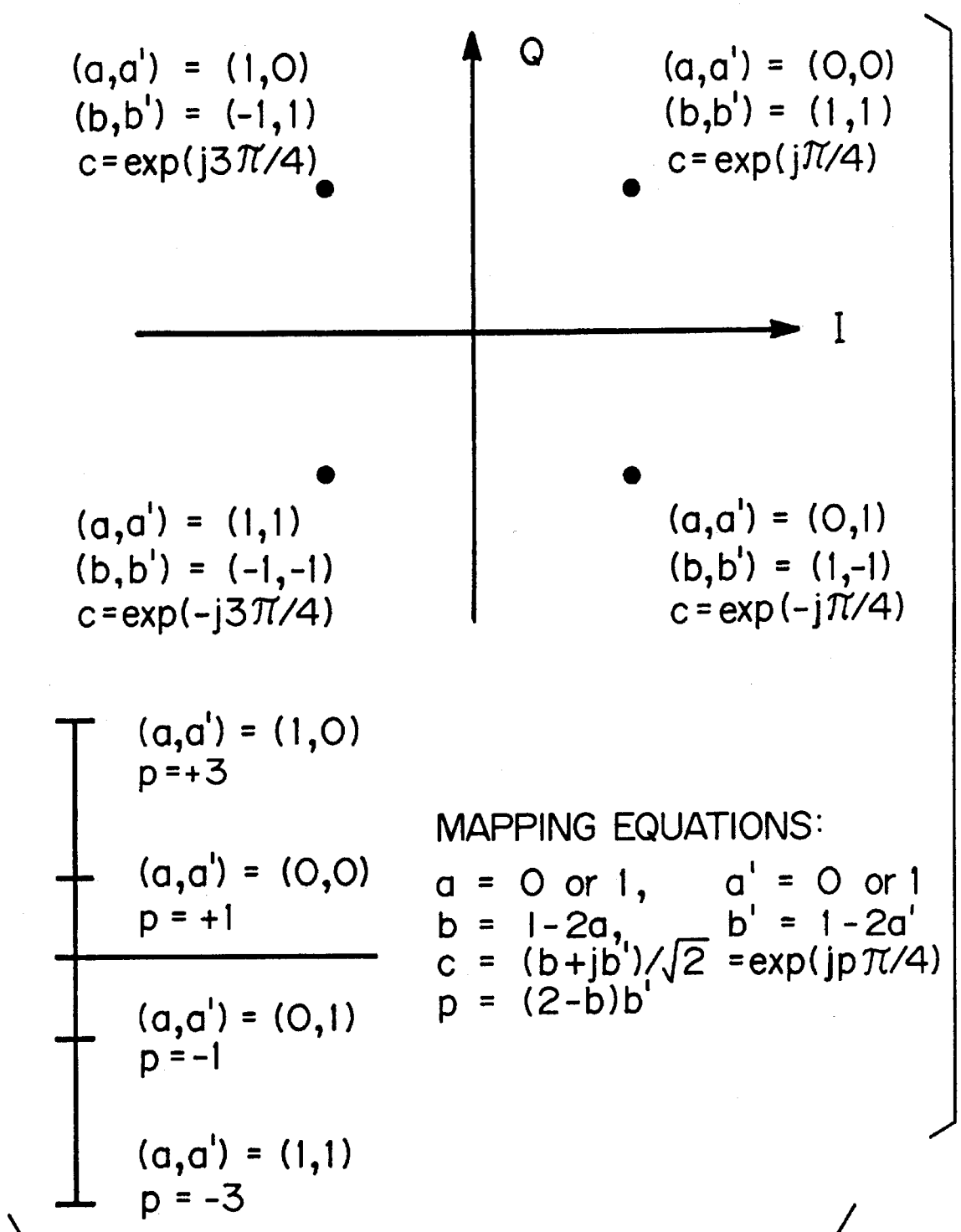

The I and Q bit streams, $a_n$ and $a'_n$ are mapped into the complex symbols $c_n$ in a mapping processor 1, according to mapping rules illustrated in FIG. 2. These complex symbols are then differentially encoded to produce the symbols $d_n$, in accordance with the equation $$d_n = c_n d_{n-1}$$

Figure 3A:
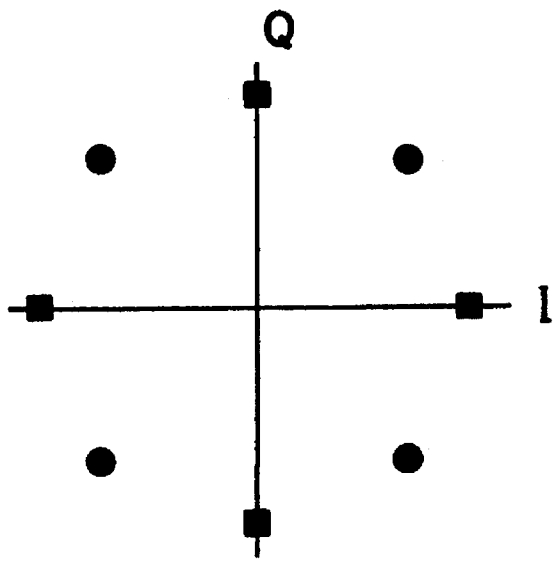
Figure 3B:
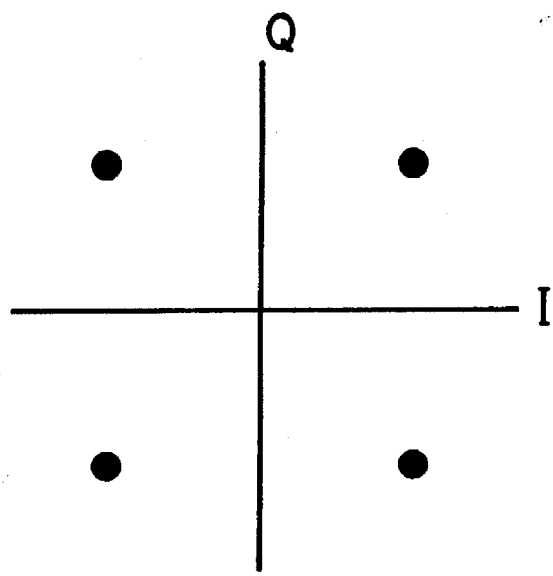

The differentially encoded symbols, $d_n$, represent a signalling constellation with eight possible phase points, as shown in FIG. 3A for π/4-DQPSK and PFM4. Only one of four phases is possible per symbol. The signalling constellation for DQPSK is shown in FIG. 3B for comparison. The only difference between 4-DQPSK and DQPSK constellations is that in the former, each symbol is rotated by an additional π/4 radians relative to the last symbol.

Returning to FIG. 1, the differentially encoded symbols $d_n$ are then used to excite a transmit filter 5. The signal at the output of the transmit filter 5 is given by $$s(t) = \sum_n d_n(t - nT)$$

The output signal of the transmit filter is applied to a hard limiter 7. After up conversion to the transmit radio frequency, the output of the hard limiter is applied to a non-linear transmit amplifier. The hard limiter is used to minimize the phase distortion introduced by the non-linear amplifier.

Figure 4:
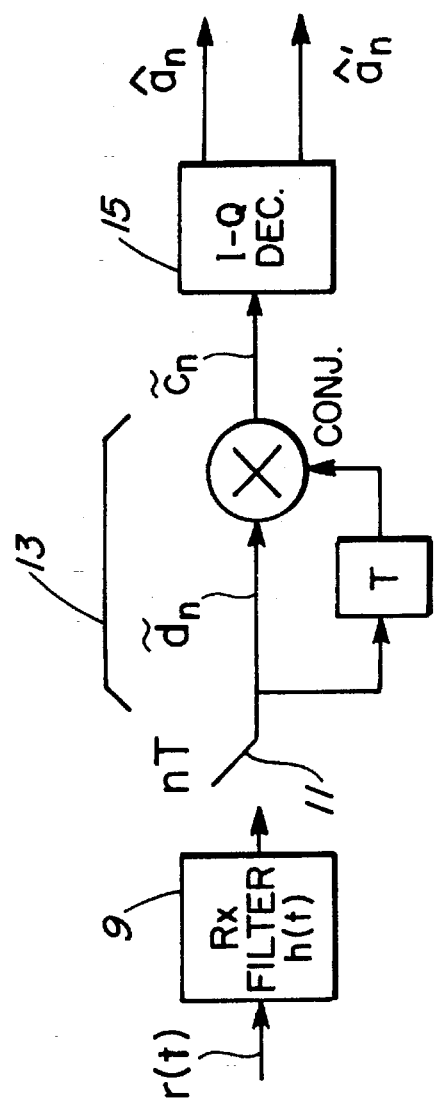

FIG. 4 illustrates a simple differential detector for use at the receiver for π/4-DQPSK signals transmitted by the aforenoted structure.

The received input signal is down converted to complex baseband, and the resulting signal r(t) is given by $$r(t) = e^{j\Theta} S_{HL}(t) + w(t)$$

where Θ represents an unknown phase rotation, and w(t) represents complex baseband additive noise and all other interfering signals. That signal is applied to a receiver filter 9 where by the signal is sampled (represented by switch 11) and the sampled output of the receive filter is given by $$\hat{d}_n = \int r(\alpha) h(nT - \alpha) \partial\alpha$$

Except for the unknown phase rotation, the sampled output of the receiver filter corresponds to the differentially encoded symbols, $d_n$ in the π/4-DQPSK modulator. This is differentially detected in detector 13, to provide an estimate of the original complex information symbols $c_n$, wherein $$\hat{c}_n = \hat{d}_n \tilde{d}^*_{n-1}$$

The final orthogonal I and Q data signals are determined by an inverse to the mapping in the modulator, in decision circuit 15, in accordance with the mapping rules shown in FIG. 2. The resulting output signals are $\hat{\alpha}_n$ and $\hat{\alpha}'_n$, which correspond to the input signals to the transmitter $\alpha_n$ and $\alpha'_n$.

Using a linear transmit amplifier, the performance of the system in AWGN is optimized by using matched root-Nyquist transmit and receive filters. Root-raised cosine filters with a specified roll-off are commonly employed. The roll-off parameter r determines the amount of excess bandwidth. This parameter also affects the envelope fluctuations of the modulated signal. Large envelope fluctuations result in high spectral side lobes after passing through the hard limiter. It has been found that the envelope fluctuations of the π/4-DQPSK modulated signal with root-raised cosine transmit filtering are minimized for roll-offs in the vicinity of 0.6 to 0.7. A transmit and receive filter roll-off of r=0.6 has been selected for a comparison of the results with the present invention.

Figure 5:
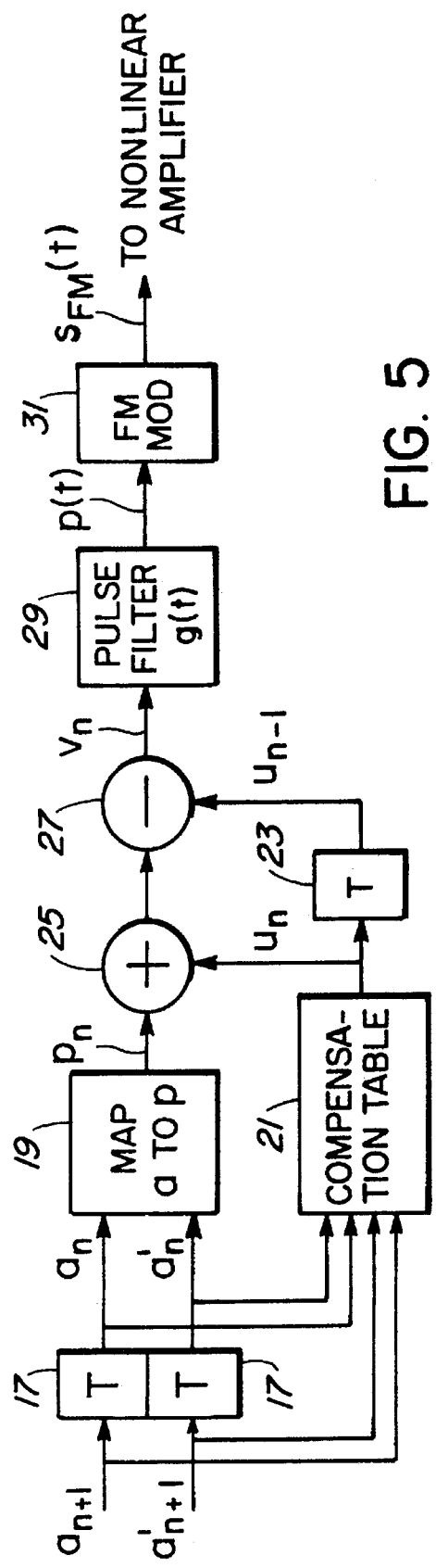

FIG. 5 is a block diagram illustrating a preferred embodiment of the modulator system for the present invention, referred to as a PFM4 modulator, with a two symbol (4 bit) compensation table.

The real and imaginary input data bits $a_{n+1}$ and $a'_{n+1}$ are applied to two delaying elements 17 which delay each bit by one symbol period. The delayed bits $a_n$ and $a'_n$ are applied to a mapping processor 19.

The undelayed bits $a_{n+1}$ and $a'_{n+1}$ are applied with the delayed bits $a_n$ and $a'_n$ to a two symbol (4-bit) compensation table 21.

Letting s denote the number of bits spanned by the compensation table, the size of the compensation table is $2^s$ where the pattern of the s bits is used to address an element of the compensation table. The compensation table is derived from the phase errors measured at the output of the receive filter (9, 11 for a receiver comprising the structure of FIG. 4) for each bit pattern. It has been found that a span of four to eight bits appears to be sufficient for most filter combinations. Thus the compensation table is typically quite small, usually containing no more than 256 entries. This contrasts with the prior art memory capacity described in U.S. Pat. No. 5,093,637 as requiring of the order of 100 Kb.

The terms of the table are obtained from theoretical knowledge of the transmit and receive filters or by measurement of the transmitter and receiver prior to putting into use, during manufacture.

The output signal $u_n$ of the compensation table is passed through a one symbol delaying element 23 to provide the signal $u_{n-1}$.

The I and Q bit streams $a_n$ and $a'_n$ are mapped in mapper 19 into four level real symbols $p_n$ according to the mapping rules shown in FIG. 2. The levels are from the set $-3, -1, +1$ and $+3$. A Gray code mapping is preferred, to minimize the probability of bit error. The signal $p_n$ is compensated in adder 25 by the compensation signal $u_n$ and the delayed signal $u_{n-1}$ is subtracted from the result in subtractor 27. The result, signal $v_n$, is applied to pulse filter 29, and the output of the filter is applied to an FM modulator 31 having a modulation index h=0.25. The output of modulator 31 is applied to an efficient non-linear amplifier such as a saturated class-C transmitting amplifier.

With a Nyquist-3 pulse shaping filter 29, the signalling constellation at the output of the FM modulator contains eight sharp phase points and is the same as that for $\pi/4$-DQPSK, as shown in FIG. 3A. The resulting FM modulated signal is constant envelope. Thus no additional hard limiting is required to minimize phase distortion caused by a non-linear amplifier such as a class-C transmitting amplifier.

By definition $$\int_{-\infty}^{+\infty} g(t)dt = 0.5$$

and $$q(t) = \int_{-\infty}^{t} g(a)da$$

With precompensation, the complex baseband equivalent output of the FM modulator is given by:

$s_{FM}(t)=\exp(j2\pi h p(t))$ where $p(t) = \sum_n v_n q(t - nT)$ and $v_n = p_n + u_n - u_{n-1}$ The compensation signal $u_n$ is added to the nominal pulse level $p_n$ at time n, and is subtracted off at time n+1. This ensures that the signalling constellation remains stable and does not start to randomly rotate back and forth. For differential detection this subtraction is not so important. However, if coherent detection or multi-symbol non-coherent detection is to be performed, a stable signal constellation is required, and the subtraction function should be implemented.

The pulse levels, $P_n$ correspond to different phase transitions. Specifically, the four levels $-3, -1, +1$ and $+3$ correspond to overall phase transitions of $-3\pi/4, -\pi/4, +\pi/4$ and $+3\pi/4$ respectively. However these four possible phase transitions do not necessarily appear as four clean constellation points at the sampled output of the receive filter. There are two reasons for this. First, if a non-Nyquist-3 pulse shaping filter is used, which spans more than one symbol period, then the full phase transition will not be complete at the end of the symbol period. The second reason that phase distortion occurs at the receiver is due to the receive filter itself. A wide receive filter should be used if the transmitted signalling constellation is to experience little distortion. A wide receive filter will pass excessive noise and adjacent channel interference, and will result in poor performance. A compromise between noise power and distortion is made in practice, and this is true for the present invention. However the phase distortion observed following the receive filter can be partially compensated for at the transmitter by adjusting the amplitude of the pulses. This allows a wider range of trade-offs to be made, resulting in improved BER performance for most filter combinations.

Different input bit patterns give rise to different points on the signalling constellation after the receive filter. With non-Nyquist-3 pulse shaping and/or tight receive filtering many of the constellation points have large phase errors. Amplitude errors are also present, but initially, for many filter combinations, they tend to be much smaller and less significant than the phase errors. The phase of a particular point can be adjusted by increasing or decreasing the levels of certain pulses at the transmitter. Pulses at the transmitter correspond to phase transitions and not specific constellation points. The two pulses with the greatest influence on the phase error associated with a particular constellation point are the pulses corresponding to the phase transitions to and away from the point. Adding a correction term (proportional to the negative of the observed phase error) to the first pulse and then subtracting the same correction term off the second pulse will rotate the point in the desired direction. This approach also ensures that the signalling constellation remains stable, as discussed earlier.

Let a denote a specific sequence of s bits, where s is the span of the compensation table in bits. Let A denote a longer sequence of S bits, where $S \geq s$. Let A(a) denote a sequence of S bits with the specific sequence, a, centered in the middle of A. S and s are typically taken to be multiples of 4 bits for PFM4 so that an even number of symbols is spanned. The terms for the compensation table are obtained according to the following iterative procedure.

$$u_{i+1}(a) = u_i(a) - \frac{\Delta}{h\pi 2^{S-s}} \sum_{\forall A(a)} \text{phase}[\bar{d}_i(A)d^*(A)], \quad (1)$$

$$\forall a, i = 0 \ldots I-1$$

where i is the iteration index and I is the number of iterations performed. The step size $\Delta$, controls the rate of convergence, and should usually be set less than or equal to 1 to prevent over compensation. The compensation table is set to zero initially. That is $u_o(a)=0$ for all a. The term d(A) represents the desired (undistorted) constellation point for bit pattern A. The term $\tilde{d}$ (A) represents the constellation point observed after the receive filter for bit pattern A without any precompensation, and $\tilde{d}_i$ (A) represents the constellation point observed for bit pattern A with precompensation after i iterations. The summation terms represent the residual phase errors for each bit pattern, A, after each iteration. Ideally, the number of bits spanned by A should account for the total memory of the receive filter, the transmitter pulse shaping filter and the compensation table. In practice, it has been found that it is usually sufficient to span S=s+4 bits. Once the final compensation table is obtained, it is fixed, because it is only a function of the known pulse shaping filter and receiver filter. It is not a function of the non-linear amplifier.

Given a large enough table and sufficient number of iterations, it has been observed that the phase errors can be almost completely removed. This is not always desirable, however. The phase errors usually dominate initially, but as the phase errors become corrected the amplitude errors usually start to grow. For coherent detection, it is desirable to stop compensating for the phase errors when they are about the same size as the amplitude errors. For differential detection, phase errors are more detrimental than amplitude errors, especially at high SNRs, and thus the phase errors should be made smaller than the amplitude errors. The spectral sidelobes also tend to grow as more compensation is applied, increasing adjacent channel interference, and thus introducing another trade-off factor. The amount of phase compensation to be applied can be controlled by selecting the number of iterations, I, and the appropriate step size, $\Delta$, as discussed earlier.

Figure 6:
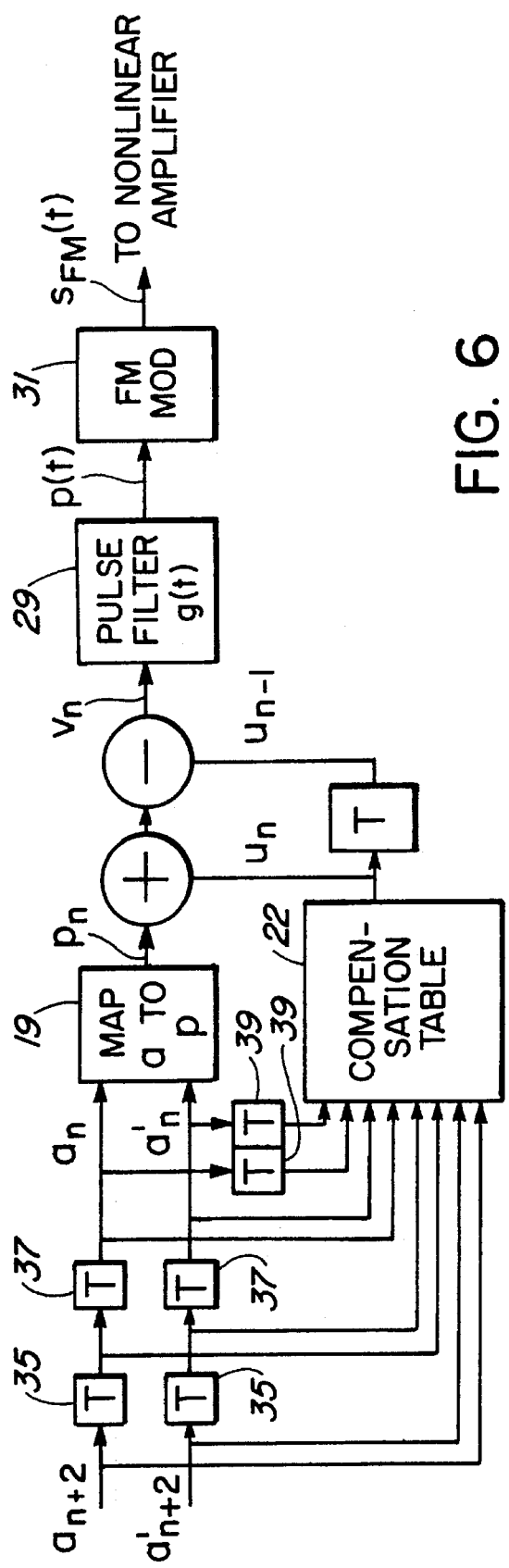

FIG. 6 shows a modulator according to the present invention with a four symbol (8 bit) compensation table 22. The real and imaginary input data bits $a_{n+2}$ and $a'_{n+2}$ are delayed by two symbol periods via delaying elements 35 and 37 before being applied to the mapping processor 19. Data bits $a_{n+2}$, $a'_{a+2}$, $a_{n+1}$, $a'_{n+1}$, $a_n$, $a'_n$, $a_{n-1}$, and $a'_{n-1}$ are taken from delay elements 35, 37 and 39 and applied to the compensation table 22. For a four symbol (8 bit) compensation table, a delay of two symbol periods has been found to be best in this case. The optimum delay depends on the specific pulse shaping and receive filters used. For symmetric filter impulse responses, the optimum delay is half the number of symbols spanned. The generalization to different sized compensation tables with different delays thus becomes obvious from the two embodiments given, in FIGS. 5 and 6.

It should be noted that with the terms of the compensation table obtained according to the iterative procedure described above, the signal can be received in the same receiver described with regard to receiving $\pi/4$-DQPSK signals, as shown in FIG. 4.

Figure 7:
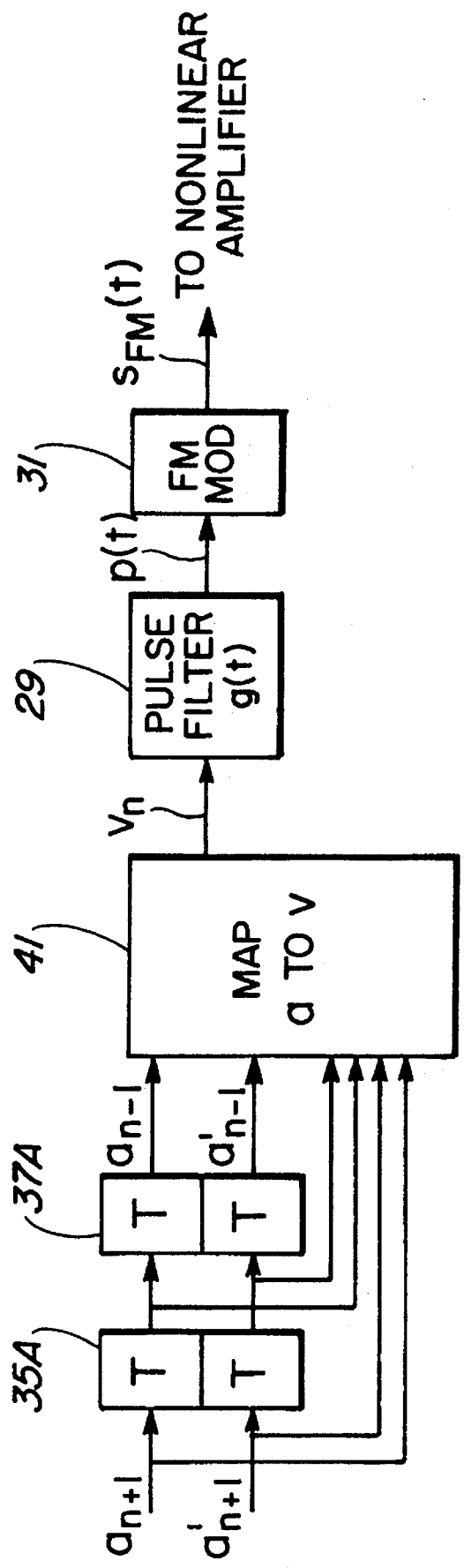

While the embodiments described with respect to the diagrams shown in FIGS. 5 and 6 can implement the present invention, the invention is not restricted thereto. For example the compensation tables could be cut in half by introducing some additional logic and taking advantage of the symmetry in the four level pulses. Alternatively, once the original compensation table has been computed, the multi-level inputs to the pulse shaping filter, vn, could be obtained directly from a mapping table four times larger than the compensation table since it is clear that each $v_n$ is only a function of s+2 bits. An equivalent implementation of the system of FIG. 5 is shown in FIG. 7, in which the mapping, compensation table and compensation functions are provided by mapping processor 41; the input signal components $a_{n+1}$ and $a'_{n+1}$ are processed through two symbol delay elements 35A and 37A to provide the corresponding inputs to the mapping processor 41. A single table containing 64 real entries, instead of 16, is required in this case. The equivalent implementation for the structure of FIG. 6 would require a table of 1,024 entries, which is still a fairly small table.

The performance of a successful laboratory prototype of the present invention, PFM4, was compared with DQPSK and $\pi/4$-DQPSK systems each with a hard limiter, to limit the phase distortion introduced by a class-C amplifier.

Figure 8:
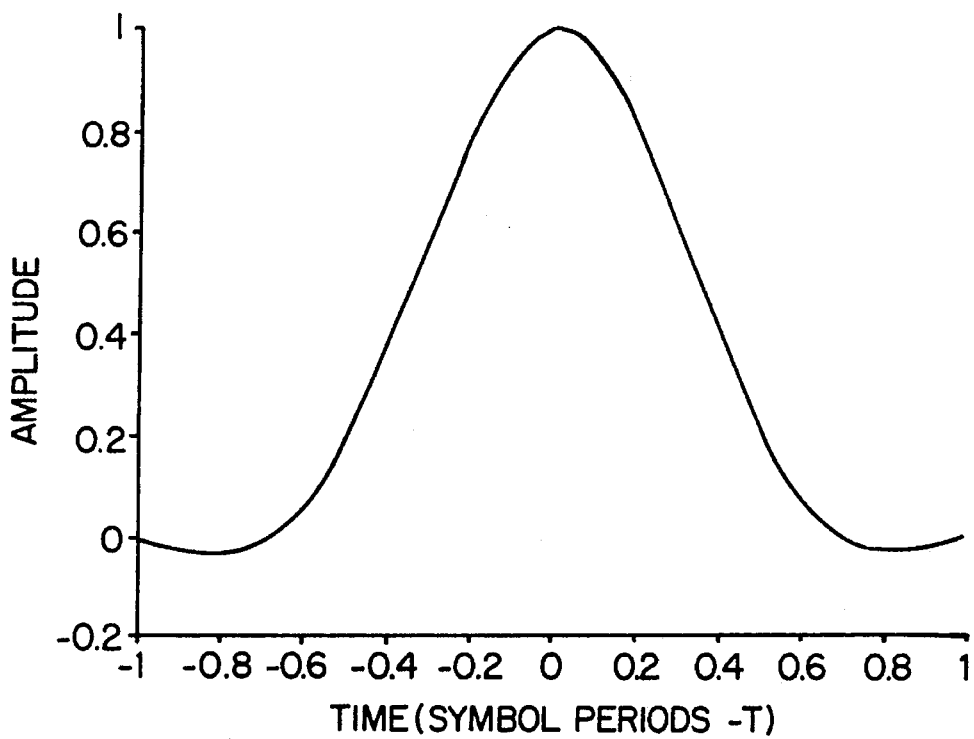

For DQPSK and $\pi/4$-DQPSK the transmit and receive filters were matched root raised cosine (RRC) filters with roll-off r=0.6. This roll-off has been found to be close to optimum for these two modulation schemes when a hard limiter is used. Very long impulse responses were used so that truncation or windowing effects could be essentially ignored. For consistency, and to illustrate the flexibility of the precompensation method, the same RRC receive filter with r=0.6 was used for the PFM4 tests. The pulse shaping filter was a raised cosine filter with a 6 dB bandwidth of 1.45 symbol rates and a roll-off of r=1.0. The impulse response for this filter is shown in FIG. 8, and was truncated to L=2 symbol periods. The bandwidth of the pulse shaping filter was selected so that the zero crossings of the impulse response would be near the truncated points at ±T. This small value of L makes the PFM4 modulator very simple to implement using current DSP technology. The impulse response does not satisfy the Nyquist-3 property. An 8-bit precompensation table was used for all the performance results to be presented.

Figure 9:
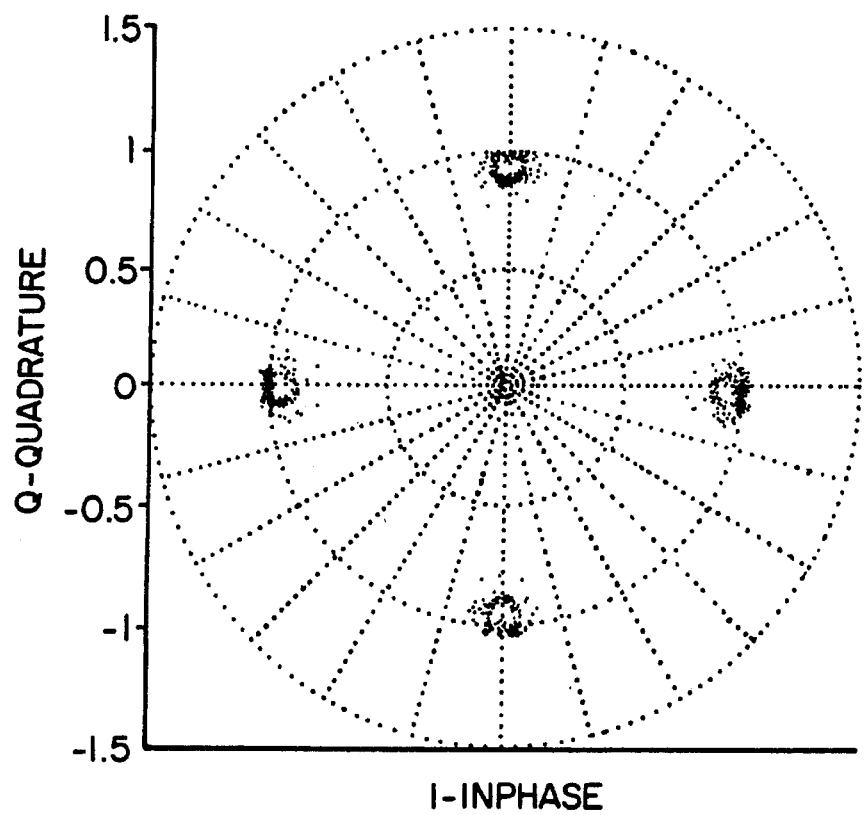
Figure 10:
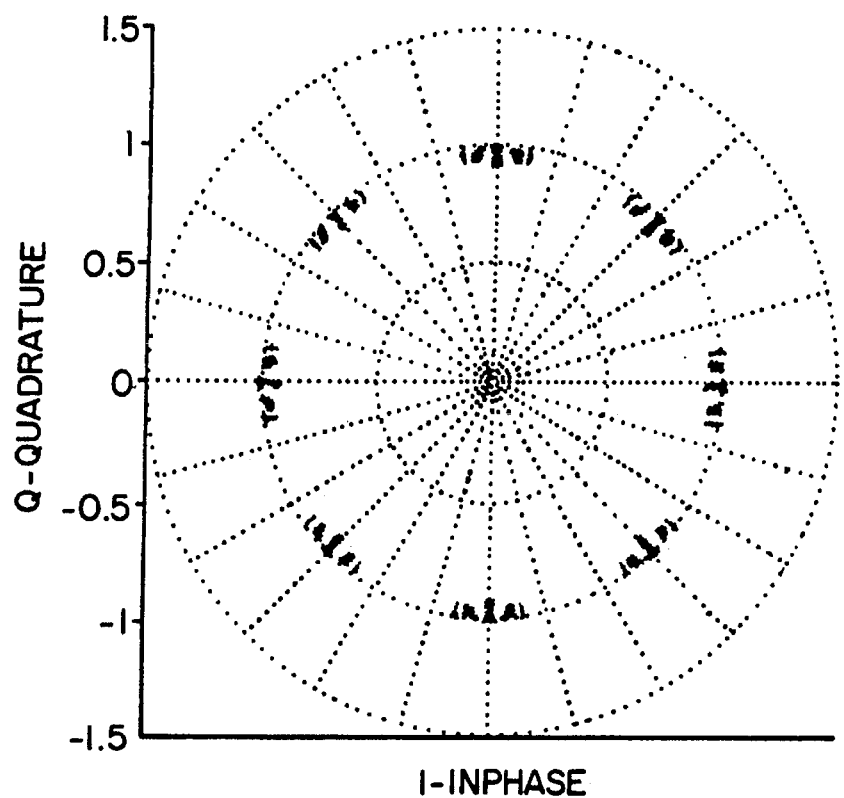
Figure 11:
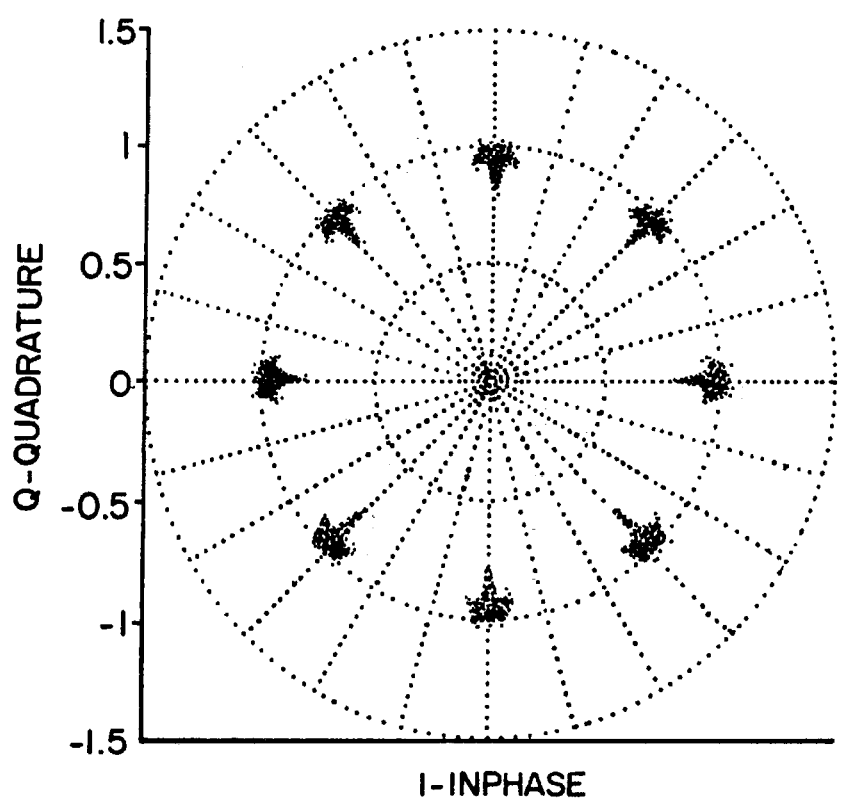
Figure 12:
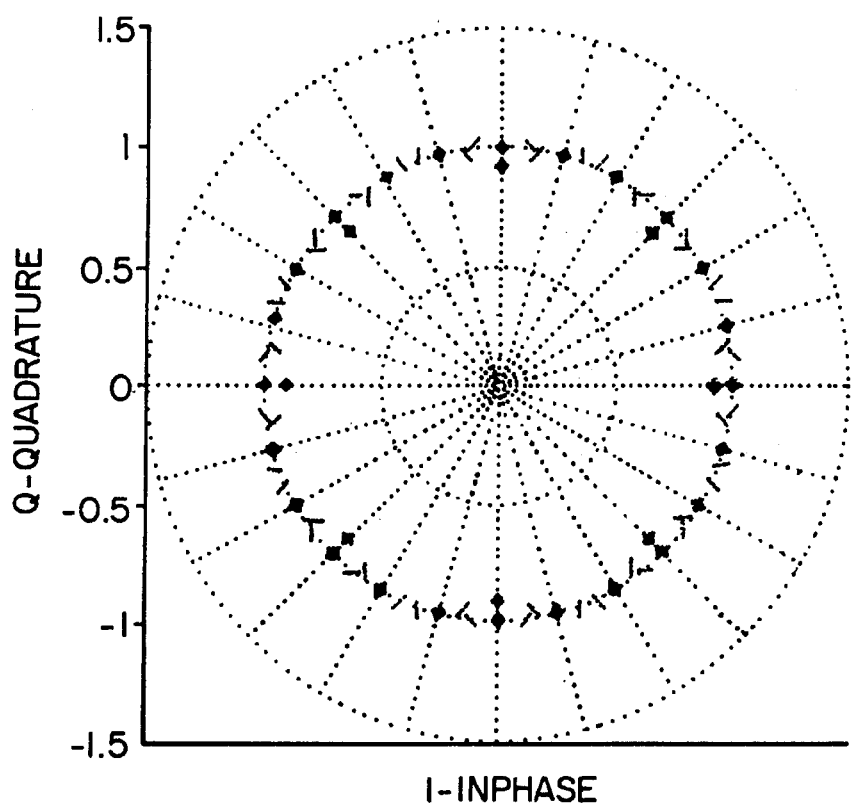

The scatter diagrams are obtained from the samples, $\tilde{d}_n$, at the output of the receive filter shown in FIG. 4. FIGS. 9, 10 and 11 show scatter diagrams for DQPSK, $\pi/4$-DQPSK, and PFM4, respectively. FIG. 12 shows a scatter diagram for FM4 without precompensation, for comparison. Ideally, these scatter diagrams should look like their corresponding signalling constellations, shown in FIGS. 3A and 3B. The distortion for DQPSK and $\pi/4$-DQPSK is caused by the hard-limiter at the transmitter. The distortion shown in FIG. 11 for PFM4 is a result of trading off phase and amplitude errors with precompensation. This scatter diagram was obtained using a step size of $\Delta=0.9$ and I=2 iterations in equation 1. The significant effectiveness of precompensation for this filter combination is easily seen by comparing FIGS. 11 and 12.

Figure 13:
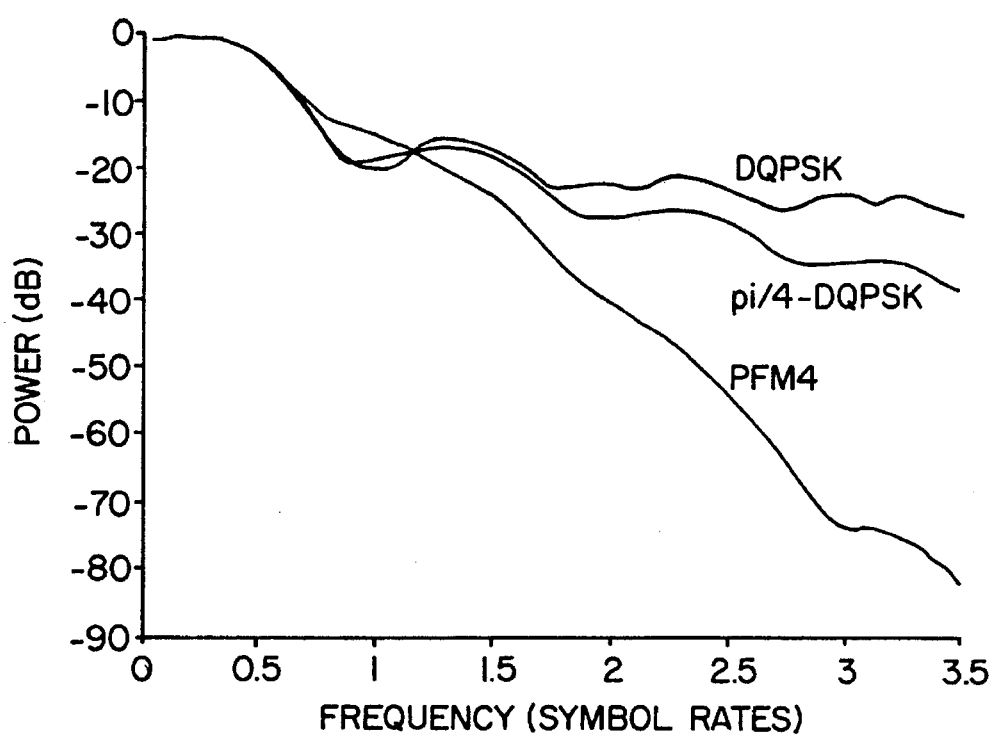

FIG. 13 shows the transmitted power spectra of DQPSK, $\pi/4$-DQPSK, and PFM4 for the given system models and parameters. These power spectra were obtained using simulation and FFT techniques. The high spectral sidelobes of DQPSK and $\pi/4$-DQPSK are due to the hard-limiter. As expected, the sidelobes for $\pi/4$-DQPSK are lower than those for DQPSK because of the more constant envelope nature of $\pi/4$-DQPSK. The improvement with PFM4 is very significant. As an example, the power spectrum of PFM4 is about 13 dB lower than that for $\pi/4$-DQPSK at a frequency of two symbol rates.

Figure 14:
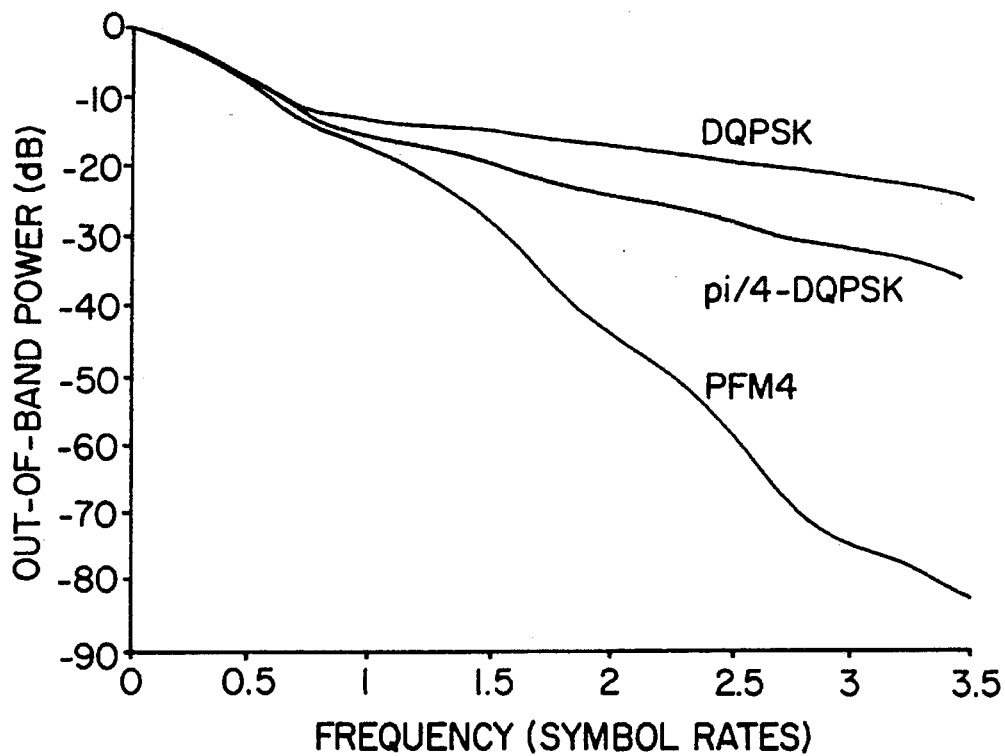

Another useful measure of spectral compactness is out-of-band power (OBP). FIG. 14 shows the OBP measurements for the three modulation schemes considered. For example, the one-sided 99% power bandwidths (OBP=–20 dB) for DQPSK, $\pi/4$-DQPSK, and PFM4 are approximately 2.7, 1.5 and 1.1 symbol rates, respectively.

Figure 15:
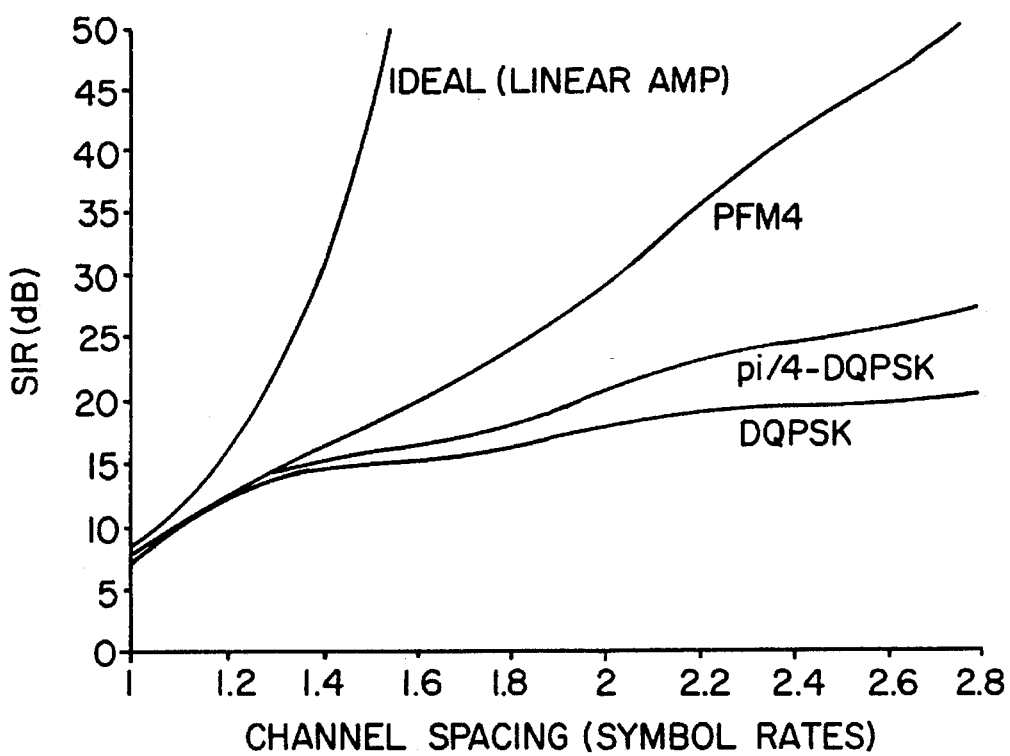

While the power spectra and OBP are both of interest, the best indication of adjacent channel interference is given by the signal-to-interference ratio (SIR), where the interference power is that passed by the specific receive filter to be used. For the results described herein, the same RRC receive filter with roll-off r=0.6 was used for all three constant envelope modulation schemes. FIG. 15 shows the SIR in dB for two equal power adjacent channel interferers, versus the channel spacing in symbol rates.

As an example, assume an SIR of 20 dB is acceptable. Then the required channel spacings for DQPSK, $\pi/4$-DQPSK, and PFM4 are approximately 2.7, 2.0 and 1.6 symbol rates. The SIR for an ideal DQPSK (or $\pi/4$-DQPSK) system with a linear amplifier is also shown for comparison. The required channel spacing for the ideal system is about 1.3 symbol rates. This figure also shows that the SIR for PFM4 at a channel spacing of 2 symbol rates is about 12 dB and 9 dB better than that for DQPSK and $\pi/4$-DQPSK, respectively.

Figure 16:
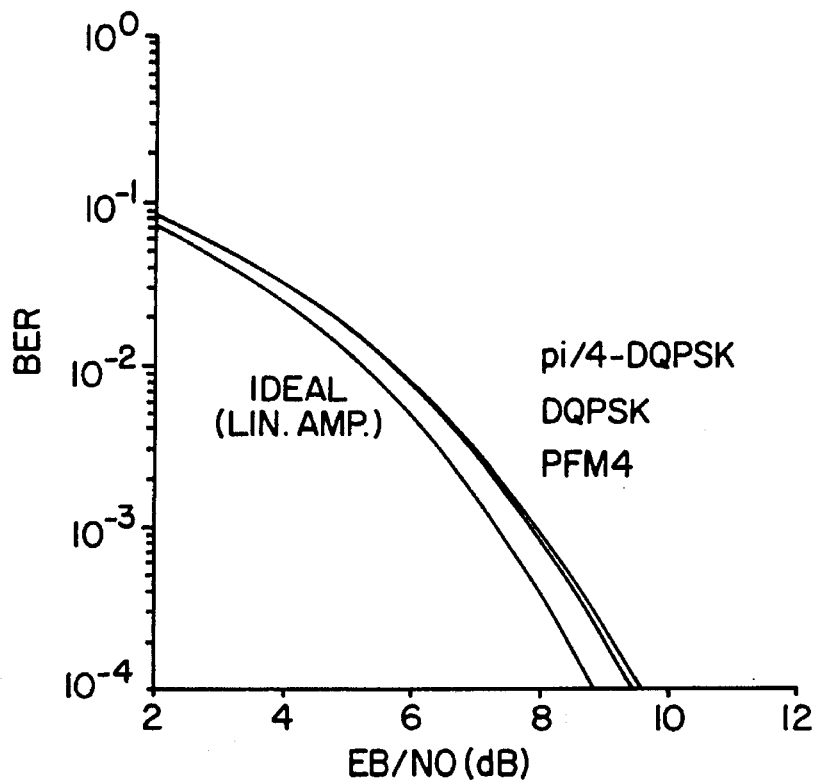

FIG. 16 shows the theoretical BER performance of DQPSK, $\pi/4$-DQPSK, and PFM4 assuming ideal coherent detection (with differential decoding) in an AWGN channel with no adjacent channel interference (ACI). These BER performance results were obtained by computing the probability of bit error for each point in the scatter diagram and averaging over all bit patterns. The theoretical performance of ideal coherently detected (differentially decoded) DQPSK with a linear amplifier is also shown for comparison. As expected from the scatter diagrams illustrated earlier, the performance of all three schemes is about the same, with π/4-DQPSK showing slightly poorer performance at high SNRs. The degration from ideal is only about 0.5 dB at a BER of 0.01.

Figure 17:
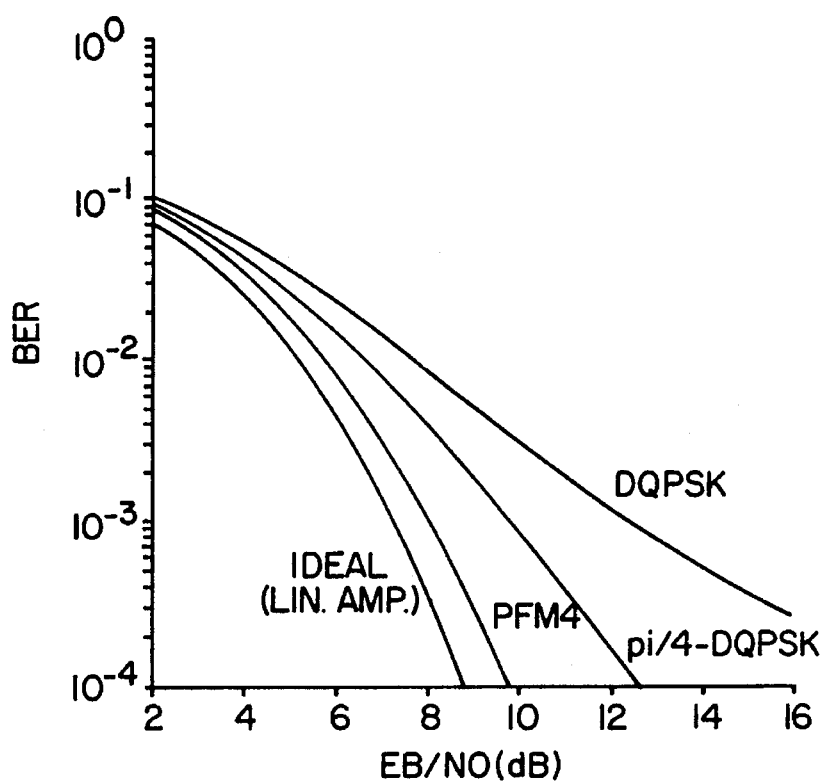

FIG. 17 shows the theoretical BER performance of the three schemes assuming ideal coherent detection (with differential decoding) in an AWGN channel with ACI. The channel spacing is 2 symbol rates and the adjacent channels are 5 dB stronger than the channel of interest. The theoretical performance of ideal coherently detected (differentially decoded) DQPSK with a linear amplifier and no ACI is also shown for comparison. As expected from the SIR results, PFM4 provides much better BER performance than DQPSK and π/4-DQPSK with ACI.

Figure 18:
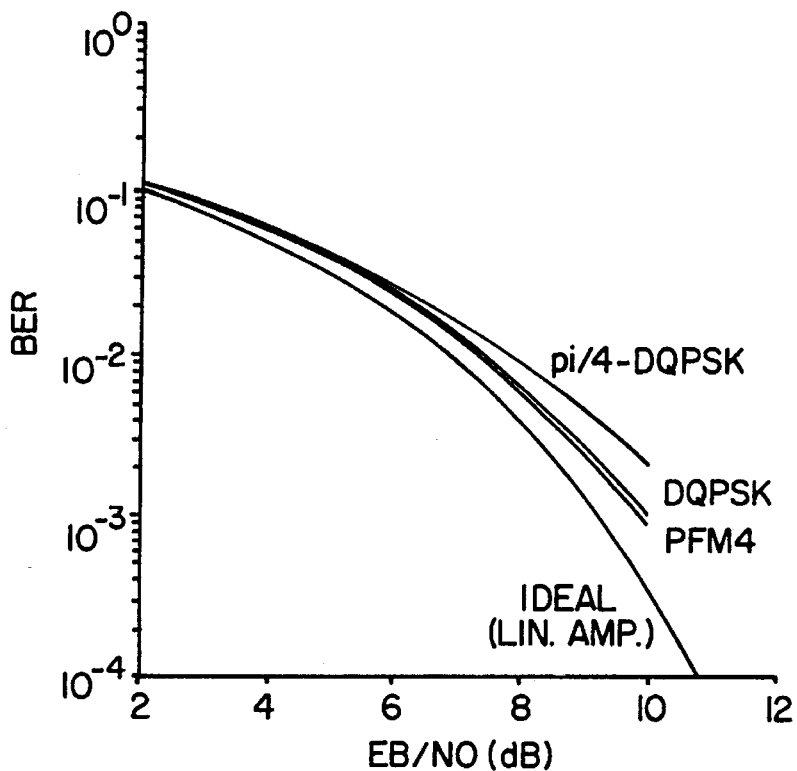

FIG. 18 shows the simulated BER performance results for differential detection in an AWGN channel with no ACI. The theoretical performance of ideal differentially detected DQPSK with a linear amplifier is also shown for comparison. The performance of PFM4 is essentially the same as DQPSK.

Figure 19:
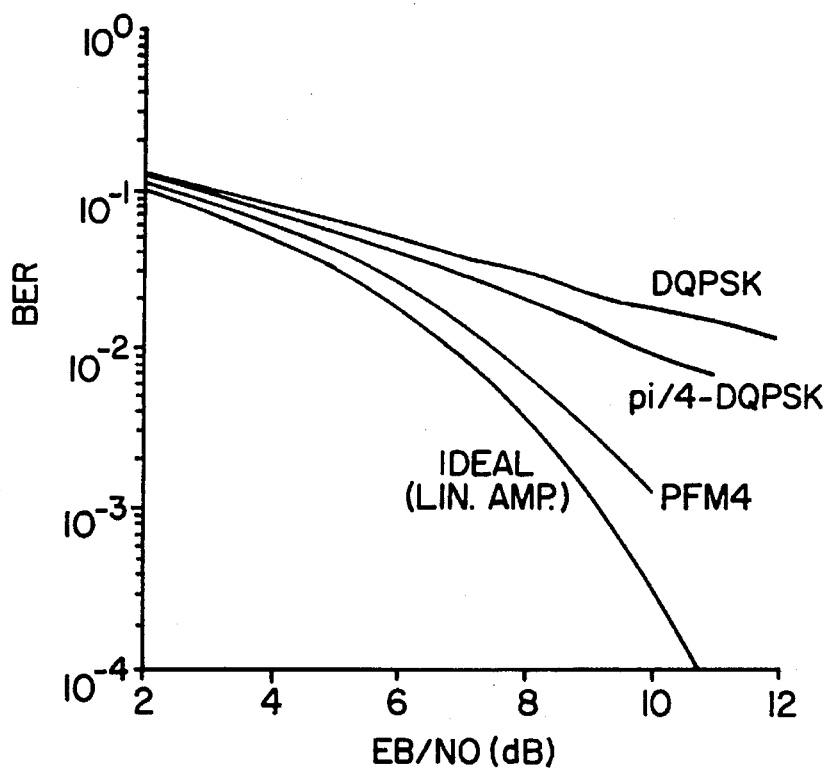

FIG. 19 shows the simulated BER performance results for differential detection in an AWGN channel with ACI. The channel spacing is 2 symbol rates and the adjacent channels are 5 dB stronger than the channel of interest. The theoretical performance of ideal differentially detected DQPSK with a linear amplifier and no ACI is also shown for comparison. As expected from the SIR results, PFM4 performs the best and DQPSK performs the worst.

A new precompensated FM (PFM) modulation technique has thus been described above and its performance characterized for a specific case of 4-level signalling with modulation index h=0.25 (PFM4). PFM4 looks like a constant envelope version of π/4-shifted differentially encoded QPSK (π/4-DQPSK), and the same type of coherent or non-coherent I-Q detector can be used to detect both schemes. Performance of the above, and DQPSK were characterized, using a low-cost power-efficient nonlinear amplifier, such as a class-C amplifier operating in saturation. Bit error rate (BER) performance of the three schemes is shown to be about the same in AWGN with no adjacent channel interference (ACI). However, the performance of PFM4 is typically much better than the performance of the other two systems when ACI is present. With a channel spacing of two symbol rates, the SIR of PFM4 is about 12 dB and 9 dB better than that experienced by DQPSK and π/4-DQPSK, respectively.

An additional advantage of PFM4 over the other two systems is the ability to easily trade-off spectral efficiency and BER performance (with no ACI). Accepting another half of a dB degradation in BER performance can significantly reduce the spectral sidelobes. This trade-off involves picking different pulse shaping filters and receive filters as well as applying different amounts of precompensation.

A person understanding this invention may now conceive of alternative structures and embodiments or variations of the above. All of those which fall within the scope of the claims appended hereto are considered to be part of the present invention.

I claim:

1. A system for transmitting constant envelope signals comprising:

(a) means for receiving an input data signal, (b) means for precompensating the received data signal, (c) means for applying the precompensated data signal to a constant envelope modulator to provide a modulated signal, (d) means for applying the modulated signal to a power efficient non-linear amplifier and transmitting a signal resulting therefrom, (e) means for receiving the transmitted signal in an I-Q receiver, (f) means for filtering the received transmitted signal for the precompensation, to obtain an output data signal representative of the input data signal, (g) the precompensating means being comprised of means for adjusting levels of data pulses in said input signal, then applying the adjusted level pulses to a pulse shaping filter, and (h) in which the precompensation is effected using the terms of a compensation table, in which the terms are obtained using an iterative procedure processing the following algorithm:

$$u_{i+1}(a) = u_i(a) - \frac{\Delta}{h\pi 2^{S-s}} \sum_{\forall A(a)} \text{phase}[\tilde{d}_i(A)d^*(A)],$$

$$\forall a, i = 0 \ldots I - 1$$

where i represents the iteration index,

I represents the number of iterations performed, a represents a specific sequence of s bits in the data signal, where s is the span of the compensation table in bits, A denotes a longer sequence of S bits, where $S \geq s$, A(a) denotes a sequence of S bits with the smaller sequence a centered within A, h is the FM modulation index, $\Delta$ is the step size, usually less than or equal to 1 to prevent over compensation, d(A) is the desired undistorted constellation point for bit pattern A, $\tilde{d}_o(A)$ is the constellation point for bit pattern A observed in the receiver means prior to compensation, $\tilde{d}_i(A)$ is the constellation point observed for bit pattern A with precompensation after i iterations, and in which the precompensation table u is initially set to zero.

2. A system as defined in claim 1, in which the constant envelope signal is one of an FM and phase modulated signal.

3. A system for transmitting FM signals, comprising:

(a) means for receiving input data bits, (b) means for applying undelayed and delayed representations of said input data bits to a compensation table, to obtain an output compensation signal, (c) means for mapping said delayed representations of said input data bits into various amplitude real symbols depending on the number of symbols, (d) means for compensating said real symbols with the output compensation signal, (e) means for applying the compensated real symbols to a pulse shaping filter, (f) means for applying the output of the pulse shaping filter to an FM modulator, and (g) means for applying the output of the FM modulator to a non-linear amplifier.

4. A system as defined in claim 3 in which the terms of the compensation table are obtained using an iterative procedure processing the following algorithm:

$$u_{i+1}(a) = u_i(a) - \frac{\Delta}{h\pi 2^{S-s}} \sum_{\forall A(a)} \text{phase}[\tilde{d}_i(A)d^*(A)],$$

$$\forall a, i = 0 \ldots I-1$$

where i represents the iteration index,

I represents the number of iterations performed, a represents a specific sequence of s bits in the data signal, where s is the span of the compensation table in bits, A denotes a longer sequence of S bits, where $S \geq s$, A(a) denotes a sequence of S bits with the smaller sequence a centered within A, h is the FM modulation index, $\Delta$ is the step size, usually less than or equal to 1 to prevent over compensation, d(A) is the desired undistorted constellation point for bit pattern A, $\tilde{d}_o(A)$ is the constellation point for bit pattern A observed in the receiver means prior to compensation, $\tilde{d}_i(A)$ is the constellation point observed for bit pattern A with precompensation after i iterations, and in which the precompensation table u is initially set to zero.

5. A system as defined in claim 4, including means for receiving the transmitted signal in an I-Q receiver, and means for filtering the received transmitted signal to obtain an output data signal representative of the input data signal.

6. A system as defined in claim 3 in which the means for compensating is comprised of means for delaying the output compensation signal by one symbol period, for adding the compensation signal to various amplitude ones of said real symbols, and for subtracting the delayed output compensation signal from a sum of said various amplitude ones of said real signals and said compensation signal.

* * * * *